United States Patent [19]
Lee

[11] Patent Number: 5,770,350
[45] Date of Patent: Jun. 23, 1998

[54] METHOD FOR FORMING PATTERN USING MULTILAYER RESIST

[75] Inventor: Jun Seok Lee, Seoul, Rep. of Korea

[73] Assignee: LG Semicon Co. Ltd., Chungcheongbuk-Do, Rep. of Korea

[21] Appl. No.: 615,634

[22] Filed: Mar. 13, 1996

Related U.S. Application Data

[63] Continuation of Ser. No. 395,166, Feb. 27, 1995, abandoned, which is a continuation of Ser. No. 149,640, Nov. 9, 1993, abandoned.

[51] Int. Cl.$^6$ ............................................ G03C 5/00
[52] U.S. Cl. .................. 430/325; 430/313; 430/314; 430/316; 430/317; 430/323; 430/394; 216/41
[58] Field of Search .................. 430/313, 314, 430/316, 317, 323, 325, 394; 156/661.11, 652.1; 216/41, 49

[56] References Cited

U.S. PATENT DOCUMENTS

| | | | |
|---|---|---|---|
| 3,962,004 | 6/1976 | Sonneborn | 430/323 X |
| 4,557,797 | 12/1985 | Fuller et al. | |
| 4,568,411 | 2/1986 | Martin | 430/314 X |
| 4,587,208 | 5/1986 | Kadowaki et al. | |
| 4,683,024 | 7/1987 | Miller et al. | |
| 4,732,841 | 3/1988 | Radigan. | |
| 4,770,739 | 9/1988 | Orvek et al. | |
| 4,891,049 | 1/1990 | Dillon et al. | |
| 4,891,303 | 1/1990 | Garza et al. | |
| 4,973,544 | 11/1990 | Slayman et al. | 430/323 |
| 4,976,818 | 12/1990 | Hashimoto et al. | |
| 5,071,694 | 12/1991 | Uekita et al. | |
| 5,126,231 | 6/1992 | Levy | 430/313 |
| 5,169,494 | 12/1992 | Hashimoto et al. | |
| 5,266,446 | 11/1993 | Chang et al. | 430/314 |
| 5,275,695 | 1/1994 | Chang et al. | 156/661.1 |

*Primary Examiner*—George F. Lesmes
*Assistant Examiner*—Bernard P. Codd
*Attorney, Agent, or Firm*—Morgan, Lewis & Bockius LLP

[57] ABSTRACT

A method for forming a pattern using a multilayer resist including the steps of: coating a first lower resist layer on a substrate having a lower level region and an upper level region; selectively subjecting the upper level region to an over exposure using a mask; subjecting the first lower resist layer to a development process; coating a second lower resist layer on the first lower resist layer and the upper level region; forming an intermediate layer on the second lower resist layer; coating an upper resist layer on the intermediate layer; patterning the upper resist layer to form a predetermined upper resist pattern; transferring the upper resist pattern to the intermediate layer to form an intermediate pattern; and transferring the intermediate pattern to the first and second lower resist layers.

18 Claims, 7 Drawing Sheets

F I G.2D
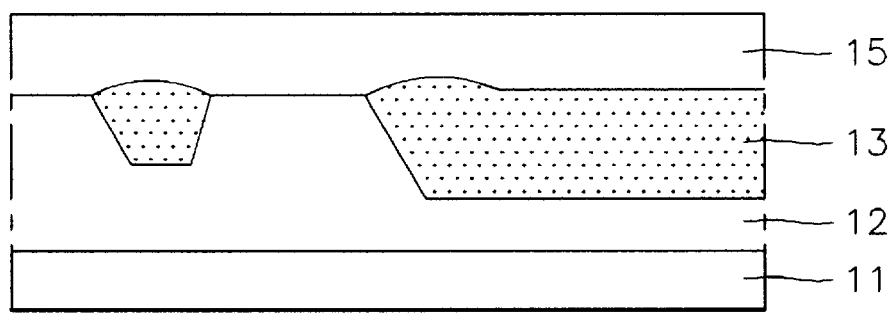
F I G.2E
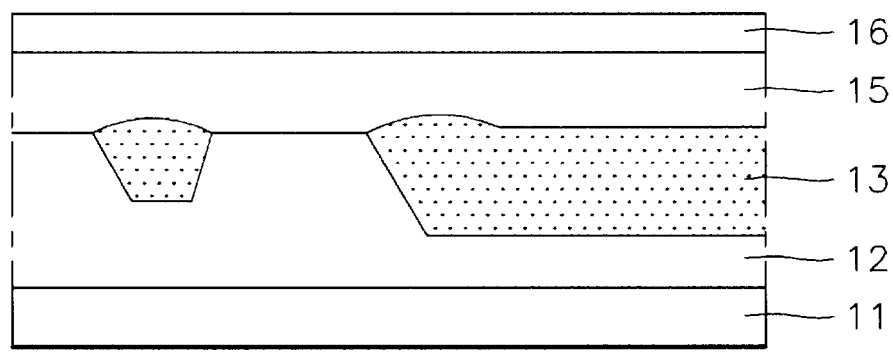
F I G.2F
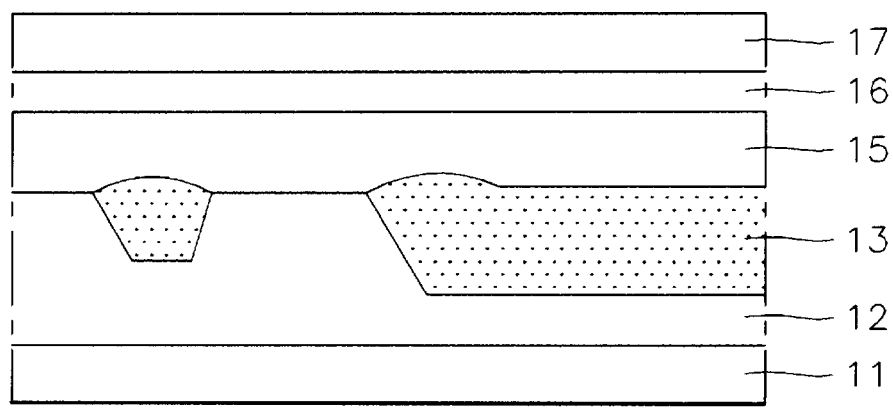

F I G.3A
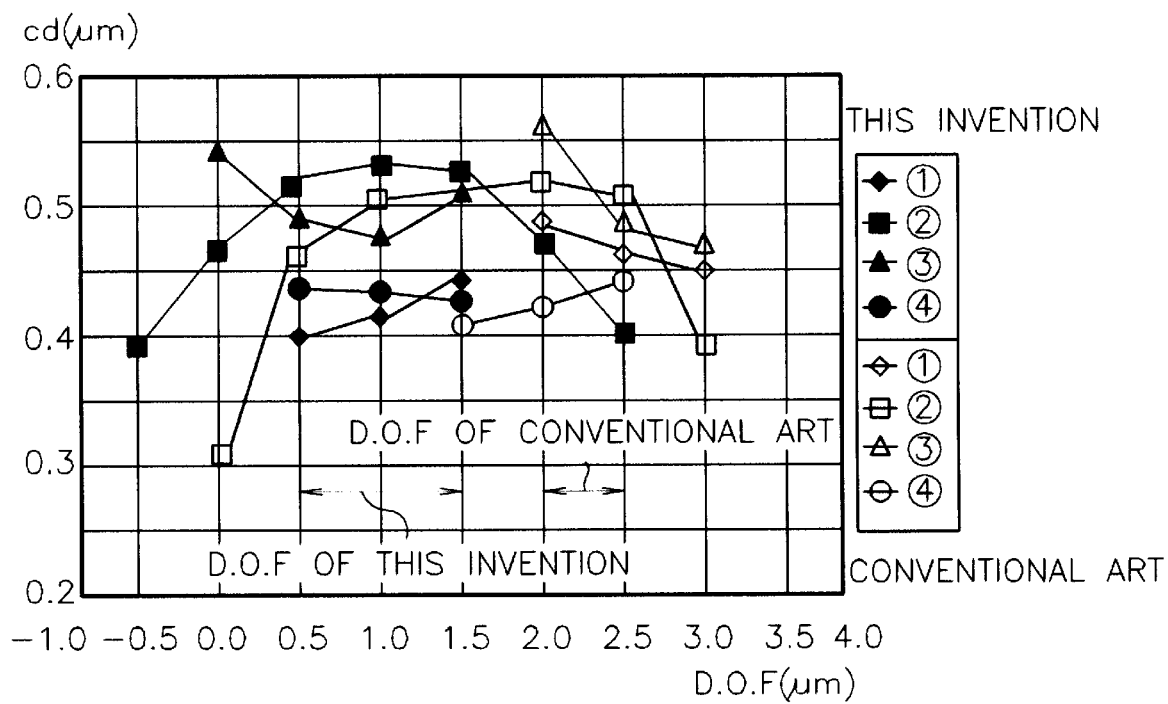
F I G.3B
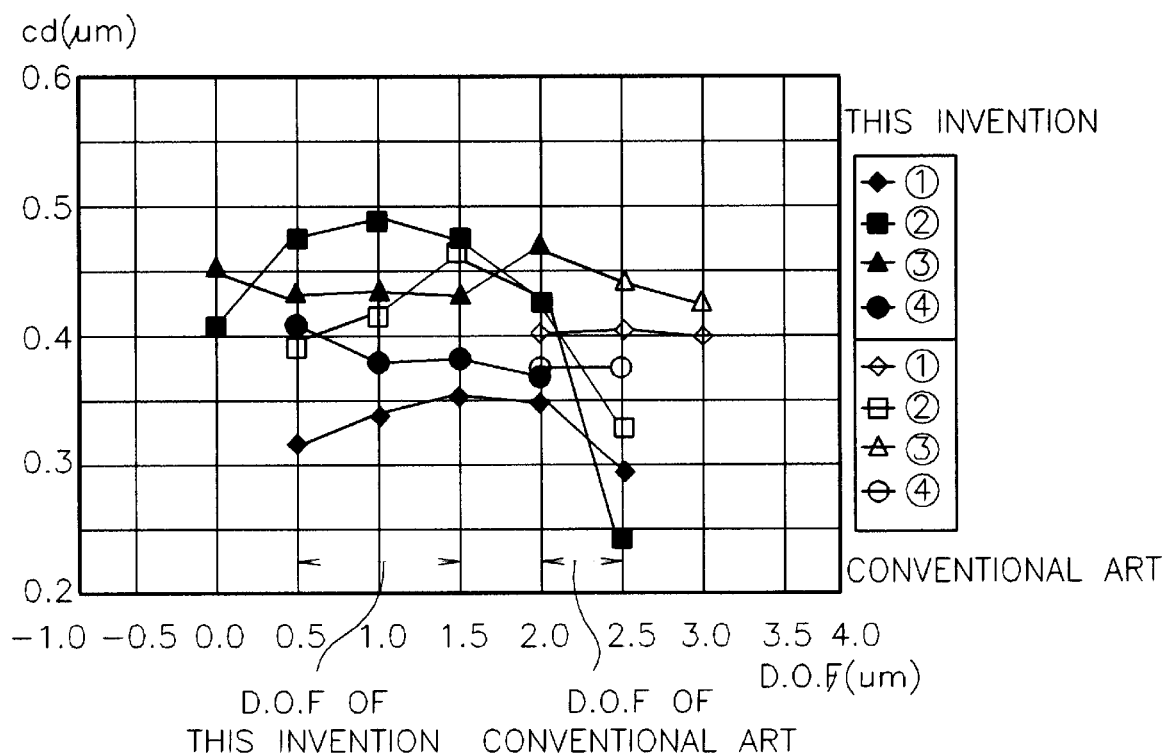

D.O.F OF THIS INVENTION

D.O.T OF FLAT WAFER

METHOD FOR FORMING PATTERN USING MULTILAYER RESIST

CROSS-REFERENCE TO RELATED APPLICATION

This application is a continuation of application Ser. No. 08/395,166, filed Feb. 27, 1995, now abandoned, which is a continuation of application Ser. No. 08/149,640, filed Nov. 9, 1993, now abandoned.

BACKGROUND OF THE INVENTION

The present invention relates to fabrication of semiconductor integrated circuit devices, and more particularly to a method for forming a pattern using a multilayer resist.

As the design rule in device design for fabrication of semiconductor integrated circuits becomes strict, steps present on surfaces of semiconductor devices serve as a limitation on pattern formation. As a result, a lithography using multilayer resists has been recently used, in place of pattern formation methods using singlelayer resists.

For solving the above-mentioned problem, there have been proposed a double-layer resist process and a triple-layer resist process. These methods are sophisticated techniques which involve coating a thick lower resist, reducing a step formed, and then forming an upper resist over the resulting structure, thereby capable of reducing an effect of the step and minimizing a pattern defect caused by a light scattering occurring upon an exposure by reticle.

A method for forming a pattern by use of such a conventional triple-layer resist process will now be described, in conjunction with a semiconductor memory structure wherein a step defined between a cell portion and a peripheral circuit portion after formation of a capacitor is not less than about 1.5 μm.

FIGS. 1a to 1f illustrate such a pattern formation method using the conventional triple-layer resist process.

In accordance with this method, over a substrate 1 having a step resulted from a formation of an element 2, a lower resist layer 3 is coated to reduce the step, as shown in FIG. 1a. In FIG. 1a, the reference character I denotes an inter-element isolation region in a semiconductor memory device, II an element, namely, a region where a capacitor and other elements are formed, and III a peripheral portion. The element II constitutes a-cell portion of the device together with the isolation region I.

An intermediate layer 5 is formed over the lower resist layer 3, as shown in FIG. 1b. This intermediate layer 5 is made of a material capable of shielding an light scattering effect of an upper resist layer which will be formed at a subsequent step.

Over the intermediate layer 5, an upper resist layer 6 is coated, as shown in FIG. 1c. The upper resist layer 6 is then patterned by use of a photolithography process under a condition that a mask (not shown) is used to form a predetermined pattern, as shown in FIG. 1d.

Using the patterned upper resist layer 6 as a mask, the intermediate layer 5 disposed beneath the upper resist layer 6 is then etched so as to form a mask pattern of the intermediate layer 5, as shown in FIG. 1e.

Thereafter, the lower resist layer 3 is etched using the patterned intermediate layer 5 as a mask, thereby forming a lower resist pattern, as shown in FIG. 1f.

Although this conventional multilayer resist process can provide easily improved resolution limit and depth of focus for a step of no more than 1.0 μm, such effects are degraded for a step of above 1.0 μm.

Where the step has a dimension of no less than 1.5 μm, as shown in FIGS. 1a to 1f, it still remains even after it has been coated with a multilayer resist. As a result, a light exposure may be irregular when the upper resist layer is subjected to a patterning. This results in an occurrence of a bridge in formation of a pattern.

Furthermore, the remaining step causes a serious critical dimension (CD) bias problem that a uniform pattern can not be obtained throughout its dimension even after an appreciate CD adjustment.

Another pattern formation method using the multilayer resist process has been proposed in U.S. Pat. No, 4,557,797. This method provides a multilayer resist structure comprising upper and lower resist layers made of a photoresist material and an intermediate layer made of an anti-reflective material for providing a shield effect when the upper resist layer is subjected to a light exposure.

However, this method still has the problem encountered in the above-mentioned conventional method because where a high step is formed, it still remains after completion of a surface smoothing process step.

There have been proposed other methods of forming a multilayer resist structure using various materials in U.S. Pat. Nos. 4,891,303 and 4,770,739. U.S. Pat. No. 4,891,303 discloses a method providing a multilayer resist structure comprising lower and upper layers made of a novolak photoresist material and an intermediate layer made of a silicon-based polymer. U.S. Pat. No. 4,770,739 provides a multilayer resist structure comprising a lower layer made of an ultraviolet resist material and an upper layer made of a deep-ultraviolet resist material. In these methods, the above-mentioned problem can not be solved when a high step is formed.

In other words, where a semiconductor memory device is fabricated in accordance with the above-mentioned conventional methods of forming a multilayer resist, elements having different levels to define steps thereamong such as a word line strap, a main cell, a sensor amplifier and a row decoder exhibit different depths of focus when the upper resist layer of the multilayer resist is subjected to a light exposure. As a result, a pattern defect such as a bridge or a short circuit may occur between a line and a space of each part in the same exposure field. Consequently, it is very difficult to simultaneously pattern both a cell region and a peripheral region defining a high step therebetween.

SUMMARY OF THE INVENTION

Therefore an object of the invention is to solve the above-mentioned problems encountered in the prior arts and to provide a method for forming a pattern using a multilayer resist.

In accordance with the present invention, this object can be accomplished by providing a method for forming a pattern using a multilayer resist comprising the steps of: (a) forming a first lower resist layer over a lower-leveled region of a lower structure having a step to smooth an upper surface of said lower structure; (b) coating a second lower resist layer over the lower structure having said smooth upper surface; forming an intermediate layer over said second lower resist layer; (c) coating an upper resist layer over said intermediate layer; (d) patterning said upper resist layer to form a predetermined upper resist pattern; (e) transferring said upper resist pattern to the intermediate layer to form an intermediate pattern; and (f) transferring said intermediate pattern to said first and second lower resist layers.

BRIEF DESCRIPTION OF THE DRAWINGS

Other objects and aspects of the invention will become apparent from the following description of embodiments with reference to the accompanying drawings in which:

FIGS. 2a to 2i are schematic sectional views illustrating a method for forming a pattern using a multilayer resist in accordance with the present invention; and FIGS. 3a to 3d are graphs illustrating depths of focus of various step-defining portions measured at different exposure amounts after the development of the upper resist pattern, for evaluating effects of the present invention compared to the prior art.

DETAILED DESCRIPTION OF THE PREFERRED EMBODIMENTS

FIGS. 2a to 2i illustrate a method for forming a pattern using a multilayer resist in accordance with an embodiment of the present invention.

Figure 1A:
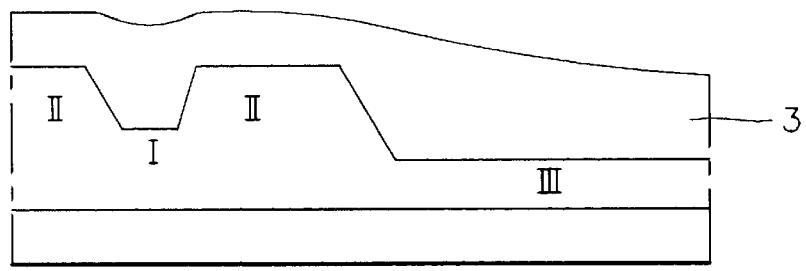
FIGS. 1a to 1f are schematic sectional views illustrating a method for forming a pattern using the conventional multilayer resist process.
Figure 1B:
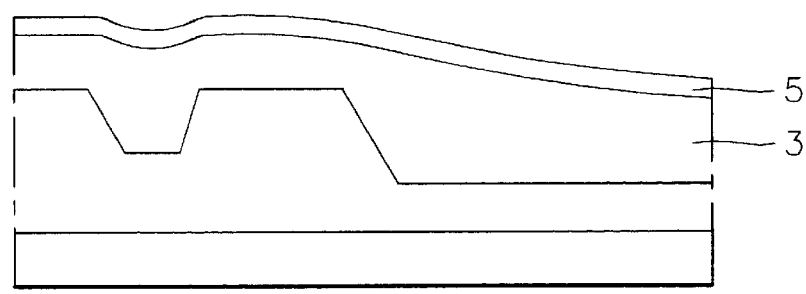
Figure 1C:
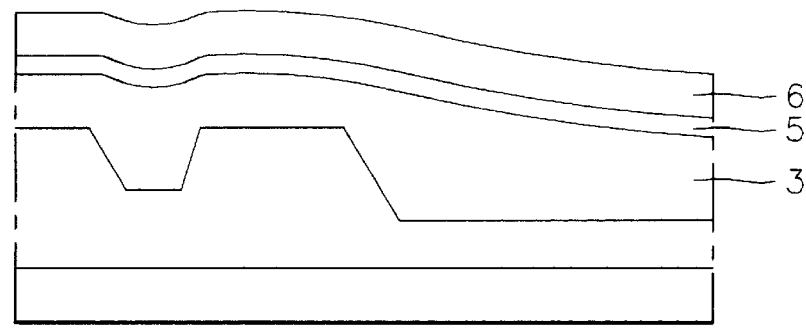
Figure 1D:
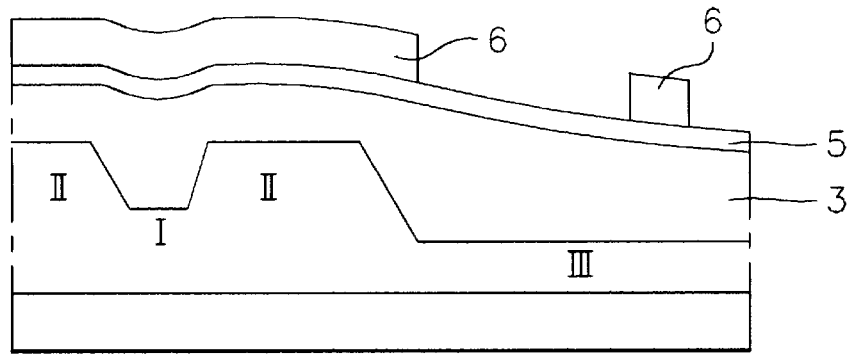
Figure 1E:
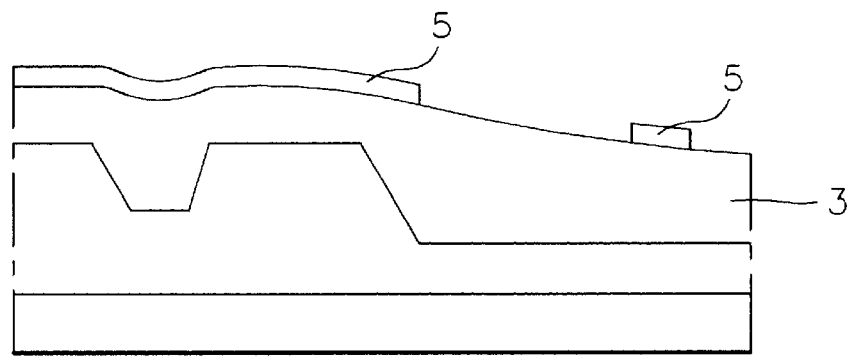
Figure 1F:
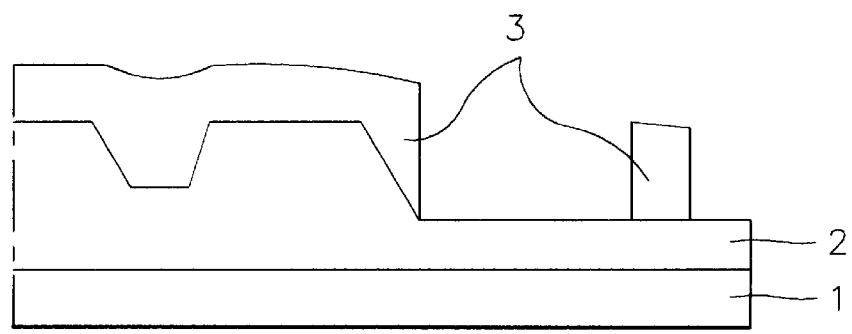
Figure 2A:
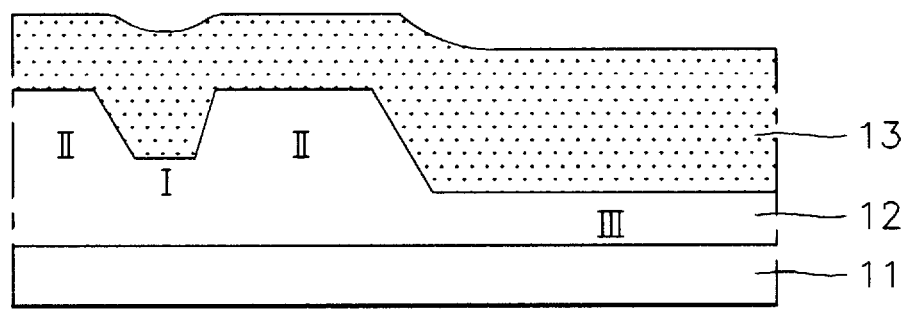

In accordance with this method, over a substrate 11 having a step including upper and lower level regions resulted from a formation of an element 12, a first lower resist layer 13 is coated to a thickness of about 1.5 $\mu$m so as to primarily smooth the surface of the substrate 11, as shown in FIG. 2a.

The first lower resist layer 13 is made of a resist material sensitive to photo spectrum. The resist material may be polymethylmethacrylate (PMMA). Alternatively, a novolak-based photoresist material may be used. In FIG. 2a, the reference character I denotes an inter-element isolation region in a semiconductor memory device, II an element, namely, a region where a capacitor and other elements are formed, and III a peripheral portion. The element II constitutes a cell portion of the device together with the isolation region I.

An advantageous smoothing effect may be obtained when the thickness of the first lower resist layer 13 of the peripheral portion III is identical to the height of the step between the upper and lower level regions defined between the cell portion II and the peripheral portion III or above 70% of the step height, at least.

Figure 2B:
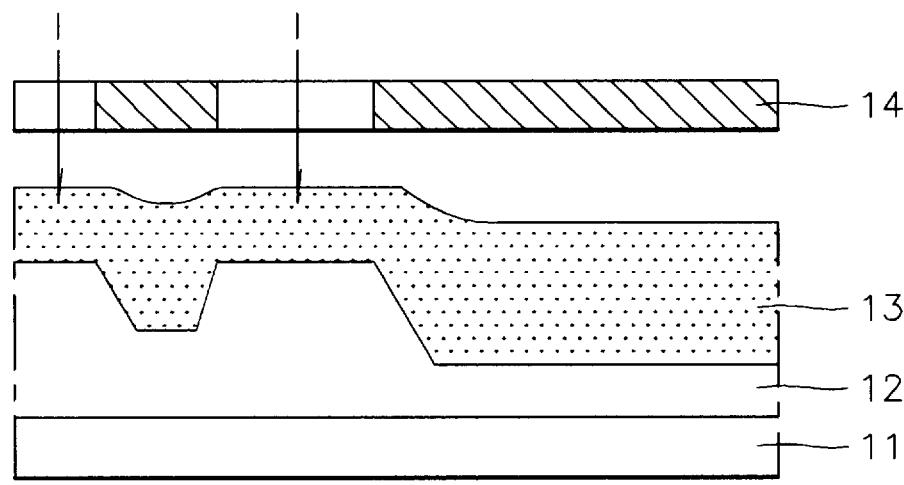
Figure 2C:
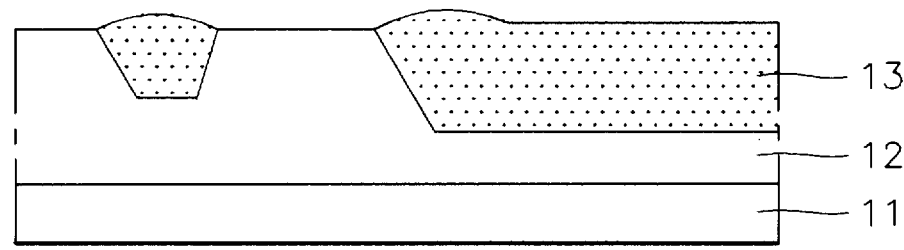

Thereafter, the upper level region of the substrate is selectively subjected to an over exposure by use of a mask adapted to expose only the cell portion II to light, for example, an ion implantation mask 14 for a cell threshold voltage adjustment, as shown in FIG. 2b. Over exposure means an exposure process in which the first photoresist is exposed so that its pattern magnitude is larger than that of the mask pattern by adjusting the quantity of light. The exposure is achieved by using an energy of 500 mJ/cm$^2$ on the basis of a CANON 2000il stepper (365 nm). The first lower resist layer 13 is then subjected to a development in a development solution for 80 seconds. By this development, the resist material present in the cell region II is completely removed, so that the resulting structure has a smooth surface, as shown in FIG. 2c.

After the development step, the resulting structure is subjected to a baking for maintaining a hardness of the first lower resist layer 13. The baking step is carried out at a temperature of 150 to 300° C., preferably 230° C., for 6 minutes. By this baking, the remaining development solution is removed.

Alternatively, an etchback process may be used after the coating of the first lower resist layer, for providing a smooth surface.

Subsequently, a second lower resist layer 15 made of a novolak-based photoresist material is coated to a thickness of 1 to 4 $\mu$m, preferably 2 $\mu$m, on the first lower resist layer and the upper level region of the substrate, as shown in FIG. 2d. Thus the first and second lower resist layers 13 and 15 make the resulting structure have a smooth surface.

An intermediate layer 16 is formed to a thickness of 0.1 to 0.5 $\mu$m, preferably 0.15 $\mu$m, over the second lower resist layer 15, as shown in FIG. 2e.

Preferably, the intermediate layer 16 is made of an inorganic material non-sensitive to photo spectrum and formable at a temperature of no more than 300° C. For example, the intermediate layer 16 is comprised of a spin-on-glass (SOG) film or a SiH$_4$-oxide film.

Then, a novolak-based photoresist material is coated to a thickness of 0.1 to 0.9 $\mu$m, preferably 0.4 $\mu$m, on the intermediate layer 16 to form an upper resist layer 17, as shown in FIG. 2f.

Figure 2G:
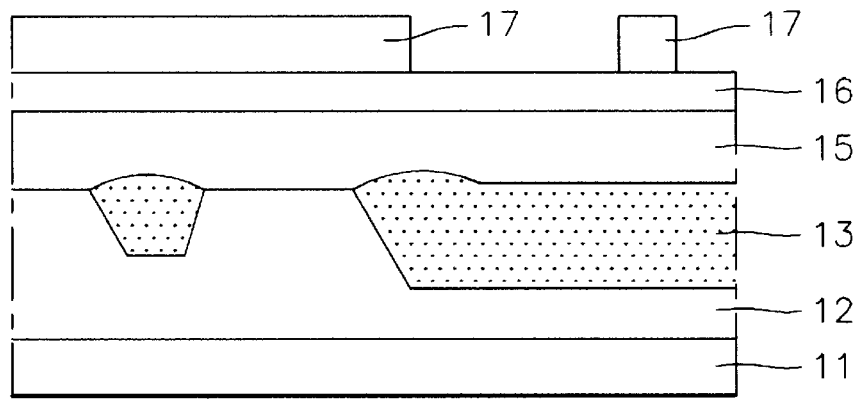
Figure 2H:
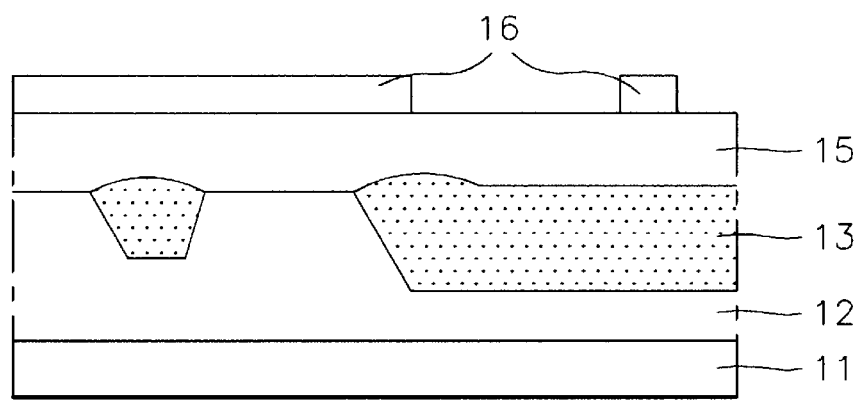

The upper resist layer 17 is then patterned by use of a photolithography process under a condition that a mask (not shown) is used to form a predetermined pattern, as shown in FIG. 2g. Using the pattern of the upper resist layer 17 as a mask, the intermediate layer 16 is then etched so that the upper resist pattern is transferred to the intermediate layer 16 to form an intermediate pattern, as shown in FIG. 2h.

Figure 2I:
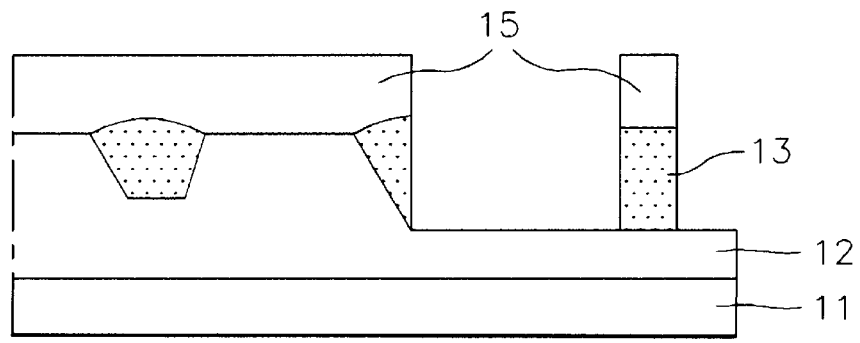

Thereafter the intermediate pattern is transferred to the first and second lower resist layers;, the first and second lower resist layers 13 and 15 are then etched using the patterned intermediate layer 16 as a mask, thereby forming a lower resist pattern, as shown in FIG. 2i. Finally, the resulting structure is dipped in a 20:1 Buffered oxide etchant (BOE) solution so as to remove the remaining intermediate layer and polymers produced during the previous steps.

FIGS. 3a to 3d illustrate depths of focus of various step-defining portions measured at different exposure amounts after the development of the upper resist pattern, for evaluating effects of the present invention compared to the prior art.

The monitored portions are four portions, namely, a word line strap (1), a main cell (2), a sensor amplifier (3) and a row decoder (4). In FIGS. 3a to 3d, the thick solid lines are for cases to which the method of the present invention is applied, whereas the thin solid lines are for cases to which the conventional triple-layer resist process is applied.

FIG. 3a illustrates a under exposure condition using an energy of 140 mJ/cm$^2$. In the conventional structure, the overlapping range of depths of focus (D.O.F) of the four monitored portions is +2.0 to +2.5 $\mu$m to have a margin of 0.51 $\mu$m. In the structure of the present invention, the overlapping range of depths of focus of the four monitored portions is +0.5 to +1.5 $\mu$m to have a margin of 1.0 $\mu$m.

FIG. 3b illustrates an optimum exposure condition using an energy of 160 mJ/cm$^2$. In the conventional structure, the overlapping range of depths of focus of the four monitored portions is +2.0 to +2.5 $\mu$m to have a margin of 0.5 $\mu$m. In the structure of the present invention, the overlapping range of depths of focus of the four monitored portions is +0.5 to +2.0 $\mu$m to have a margin of 1.5 $\mu$m.

Figure 3C:
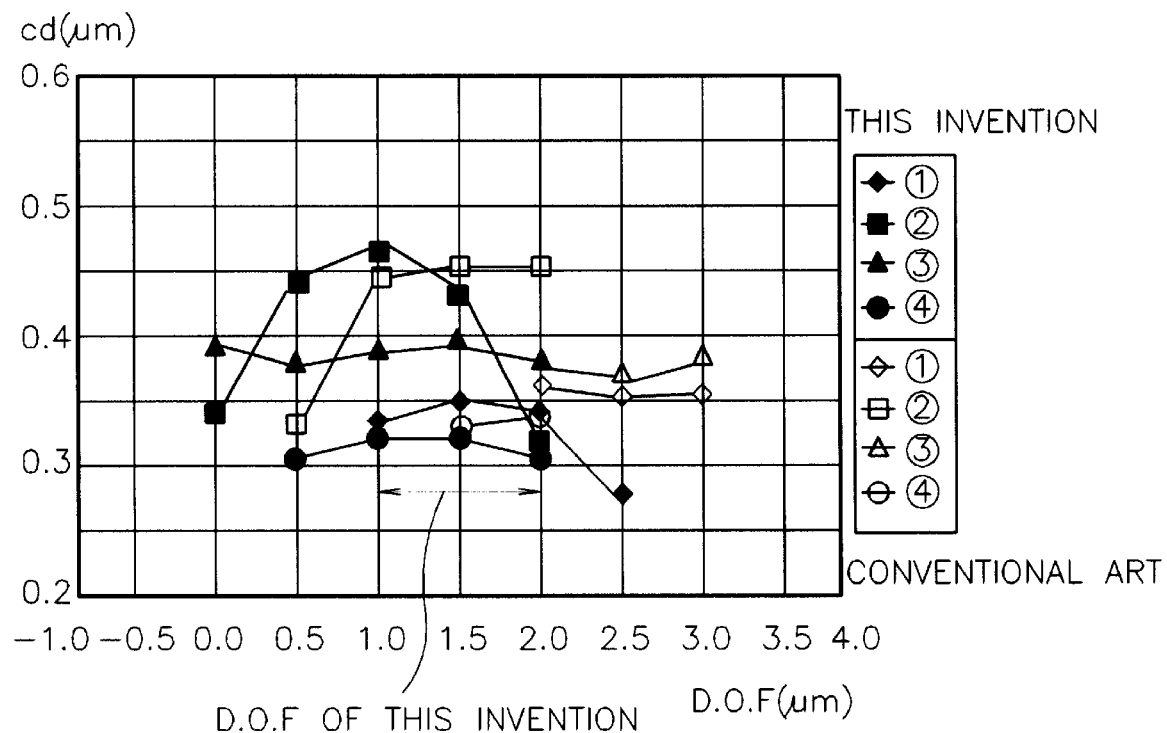

FIG. 3c illustrates an over exposure condition using an energy of 180 mJ/cm$^2$. In the conventional structure, the overlapping range of depths of focus (D.O.F) of the four monitored portions is zero. In the structure of the present invention, the overlapping range of depths of focus of the four monitored portions is +1.0 to +2.0 $\mu$m to have a margin of 1.0 $\mu$m.

Figure 3D:
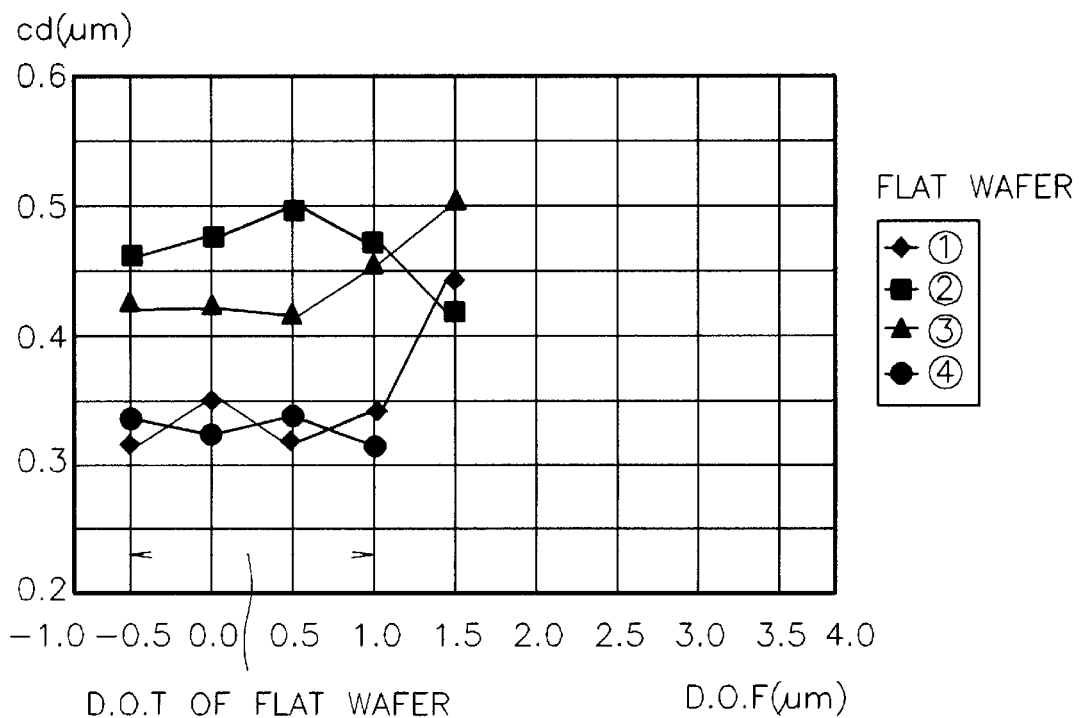

FIG. 3d illustrates a result obtained when a resist having a thickness of 0.4 μm is coated over a silicon wafer and then subjected to an exposure using an energy of 160 mJ/cm², for comparing a depth of focus in such a case having no step with the above cases having steps. In this structure, the overlapping range of depths of focus of the four monitored portions is −0.5 to +1.0 μm to have a margin of 1.5 μm.

As apparent from FIGS. 3a to 3d, the present invention can maintain a depth of focus similar to that of the case (FIG. 3d) wherein a pattern is formed on a smooth surface, even after a formation of an upper resist pattern, in that a lower resist layer coated over a lower structure portion is subjected to a smoothing treatment. As a result, it is possible to obtain a resolution limit improved by two times over that obtained by the conventional multilayer resist process. A uniform depth of focus can be obtained in one shot field upon performing an exposure for forming a upper resist pattern, irrespective of position.

As a result, the present invention can be also applied to steps defined by capacitors having a three-dimensional structure in semiconductor memory devices.

The present invention also provides an effect in terms of global planarization. Such a global planarization effect solves a problem such as a microbridge occurring during a final pattern formation. In addition, an improvement in CD bias can be achieved.

The present invention is also applied to formation of contact holes of semiconductor devices. Contact holes may exhibit different resolution limits depending on their positions, even at the same exposure energy. For example, where the present invention is applied to a case in which contact holes having the same dimension are formed at patterns having different steps such as an active region, a gate, a bit line, a word line strap and etc., a pattern for forming such contact holes can be formed by performing an exposure for the entire structure by use of one mask without separating the elements from one another.

As apparent from the above description, an effect of steps is eliminated by virtue of the fact that a lower resist layer is subjected to a smoothing treatment in accordance with the present invention. As a result, the depth of focus exhibited after development of an upper resist layer is similar to that of the wafer having a smooth surface. Moreover, the resolution limit can be improved by two times or above over the conventional cases. Even for a high step of no less than 1.5 μm formed upon an exposure of the upper resist layer, the entire pattern including a cell pattern and a peripheral pattern can be developed at once by use of one mask. This can simplify the process steps and reduce the cost.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a pattern using a multilayer resist, comprising the steps of:
   (a) coating a first lower resist layer on a substrate having a lower level region and an upper level region;
   (b) leveling the substrate by selectively subjecting the upper level region of the first lower resist layer to an over-exposure using a mask and subjecting the first lower resist layer to a development process;
   (c) coating a second lower resist layer on the first lower resist layer and the upper level region, wherein the second lower resist layer is made of a novolak-based photoresist material;
   (d) forming an intermediate layer on the second lower resist layer;
   (e) coating an upper resist layer on the intermediate layer;
   (f) subjecting the upper resist layer to a photolithography process to form an upper resist pattern;
   (g) transferring the upper resist pattern to the intermediate layer to form an intermediate pattern; and
   (h) transferring the intermediate pattern to the first and second lower resist layers.

2. The method in accordance with claim 1, wherein the first lower resist layer is made of a polymethylmethacrylate.

3. The method in accordance with claim 1, wherein the first lower resist layer is made of a novolak-based photoresist material.

4. The method in accordance with claim 1, wherein the intermediate layer comprises a spin-on-glass film.

5. The method in accordance with claim 1, wherein the intermediate layer comprises a $SiH_4$-oxide film.

6. The method in accordance with claim 1, wherein the upper resist layer is made of a novolak-based photoresist material.

7. The method in accordance with claim 1, wherein the first lower resist layer has a thickness the same as the height distance between the lower and upper level regions.

8. The method in accordance with claim 1, wherein the first lower resist layer has a thickness greater than 70% of the height distance between the lower and upper level regions.

9. A method for forming a pattern using a multilayer resist, comprising the steps of:
   coating a first lower resist layer on a substrate having a lower level region and an upper level region;
   leveling the substrate by selectively subjecting the upper level region of the first lower resist layer to an over-exposure using a mask and subjecting the first lower resist layer to a development process;
   thereafter coating a second lower resist layer on the first lower resist layer and the upper level region;
   forming an intermediate layer on the second lower resist layer;
   coating an upper resist layer on the intermediate layer;
   subjecting the upper resist layer to a photolithography process to form an upper resist pattern;
   transferring the upper resist pattern to the intermediate layer to form an intermediate pattern; and
   transferring the intermediate pattern to the first and second lower resist layers.

10. The method in accordance with claim 9, wherein the first lower resist layer is made of a polymethylmethacrylate.

11. The method in accordance with claim 9, wherein the first lower resist layer is made of a novolak-based photoresist material.

12. The method in accordance with claim 9, wherein the intermediate layer comprises a spin-on-glass film.

13. The method in accordance with claim 9, wherein the intermediate layer comprises a $SiH_4$-oxide film.

14. The method in accordance with claim 9, wherein the upper resist layer is made of a novolak-based photoresist material.

15. The method in accordance with claim 9, wherein the first lower resist layer has a thickness the same as the height distance between the lower and upper level regions.

16. The method in accordance with claim 9, wherein the first lower resist layer has a thickness greater than 70% of the height distance between the lower and upper level regions.

17. The method in accordance with claim 9, wherein the second lower resist layer is made of a novolak-based photoresist material.

18. A method for forming a pattern using a multilayer resist, comprising the steps of:
(a) coating a first lower resist layer on a substrate having a lower level region and an upper level region;
(b) leveling the substrate by selectively subjecting the upper level region of the first lower resist layer to an over-exposure using a mask and subjecting the first lower resist layer to a development process;
(c) coating a second lower resist layer on the first lower resist layer and the upper level region, wherein the first and second lower resist layers are made of a novolak=based photoresist material;
(d) forming an intermediate layer on the second lower resist layer;
(e) coating an upper resist layer on the intermediate layer;
(f) subjecting the upper resist layer to a photolithography process to form an upper resist pattern;
(g) transferring the upper resist pattern to the intermediate layer to form an intermediate pattern; and
(h) transferring the intermediate pattern to the first and second lower resist layers.

* * * * *